US011316503B2

(12) United States Patent
Gonzalez Jimenez

(10) Patent No.: US 11,316,503 B2
(45) Date of Patent: Apr. 26, 2022

(54) DEVICE FOR PHASE AND/OR AMPLITUDE MODULATION

(71) Applicant: COMMISSARIAT A L'ENERGIE ATOMIQUE ET AUX ENERGIES ALTERNATIVES, Paris (FR)

(72) Inventor: José-Luis Gonzalez Jimenez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/029,275

(22) Filed: Sep. 23, 2020

(65) Prior Publication Data

US 2021/0091758 A1 Mar. 25, 2021

(30) Foreign Application Priority Data

Sep. 24, 2019 (FR) ..................................... 19 10517

(51) Int. Cl.
| H03K 5/02 | (2006.01) |
| H03K 19/20 | (2006.01) |
| H03L 7/081 | (2006.01) |

(52) U.S. Cl.
CPC ............... *H03K 5/02* (2013.01); *H03K 19/20* (2013.01); *H03L 7/0812* (2013.01)

(58) Field of Classification Search
CPC ..... H04L 27/0014; H04L 27/22; H04L 27/20; H04L 27/362; H04L 27/361;
(Continued)

(56) References Cited

U.S. PATENT DOCUMENTS

| 9,209,748 | B2 * | 12/2015 | Siligaris | .................... H03L 7/24 |
| 9,859,991 | B2 * | 1/2018 | Jany | ........................ H04B 15/04 |

(Continued)

FOREIGN PATENT DOCUMENTS

| CN | 103199796 B | 8/2016 |
| EP | 2 786 492 B1 | 11/2015 |
| EP | 2 966 784 B1 | 4/2019 |

OTHER PUBLICATIONS

French Preliminary Search Report dated Jul. 21, 2020 in French Application 19 10517 filed on Sep. 24, 2019 (with English Translation of Categories of Cited Documents), citing documents AT & AX therein, 2 pages.

(Continued)

*Primary Examiner* — John W Poos
(74) *Attorney, Agent, or Firm* — Oblon, McClelland, Maier & Neustadt, L.L.P.

(57) ABSTRACT

A phase and/or amplitude modulation device includes a TORP signal generator and, during a phase modulation or a phase and amplitude modulation, a generator of a phase-modulated periodic signal of frequency $F_{PRP}$ applied to a control input of the power supply circuit of the TORP signal generator. The device may also include, during an amplitude modulation or a phase and amplitude modulation, $2^P$ TORP generators, a thermometric code generator on $2^P$ bits coding an amplitude modulation, a TORP generator control circuit, applying or not, to the control input of the TORP generator power supply, the periodic signal of frequency $F_{PRP}$ depending on the bits of the thermometric code signal, and a processing circuit coupled to the outputs of the TORP generators, and configured to produce a linear combination of signals outputted by the TORP generators.

20 Claims, 9 Drawing Sheets

(58) Field of Classification Search
CPC . H04L 27/2276; H04L 27/18; H04B 10/5561; H04B 15/04; H04B 1/7174; H03L 7/0812; H03L 7/099; H03L 7/24; H03L 7/18; H03K 5/02; H03K 19/20
See application file for complete search history.

(56) References Cited

U.S. PATENT DOCUMENTS

| | | | |
|---|---|---|---|
| 2013/0176005 | A1 | 7/2013 | Jin et al. |
| 2020/0091921 | A1* | 3/2020 | Jany ................. H03L 7/093 |
| 2020/0091922 | A1* | 3/2020 | Jany ................. H03L 7/06 |

OTHER PUBLICATIONS

Jany et al., "A Programmable Frequency Multiplier-by-29 Architecture for Millimeter Wave Applications", IEEE Journal of Solid-State Circuits, vol. 50, No. 7, Jul. 2015, 11 pages.

El-Gabaly et al., "A 3-10-GHz 13-pJ/Pulse Dual BPSK/QPSK Pulse Modulator Based on Harmonic Injection Locking", IEEE Transactions on Microwave Theory and Techniques, vol. 62, No. 12, Dec. 2014, 9 pages.

Lee et al., "A Novel Direct Injection-Locked QPSK Modulator Based on Ring VCO in 180 nm CMOS", IEEE Microwave and Wireless Components Letters, vol. 24, No. 4, Apr. 2014, pp. 269-271.

Lei et al., "A 20Mbps 5.8mw QPSK Transmitter Based on Injection Locking and Class-E PA for Wireless Biomedical Applications", IEEE 12$^{th}$ International Conference on ASIC (ASICON), 2017, pp. 448-451.

Saheb et al., "A 69-Mbps Dual Tuning 8PSK/QPSK Transmitter using Injection Locking and RF Phase Modulation", 2017 IEEE International Symposium on Circuits and Systems (ISCAS), 2017, 4 pages.

Ji et al., "Low-Power QPSK Transmitter based on an Injection-Locked Power Amplifier" ESSCIRC 2018—IEEE 44$^{th}$ European Solid State Circuits Conference (ESSCIRC), 2018, pp. 134-137.

Mazzanti et al. , "Analysis and Design of Injection-Locked LC Dividers for Quadrature Generation", IEEE Journal of Solid-State Circuits, vol. 39, No. 9, Sep. 2004, 9 pages.

U.S. Appl. No. 16/531,877, filed Aug. 5, 2019, Siligaris, A, et al.

U.S. Appl. No. 16/570,549, filed Sep. 13, 2019, Jany, C, et al.

* cited by examiner

DEVICE FOR PHASE AND/OR AMPLITUDE MODULATION

TECHNICAL FIELD

The invention relates to the field of the emission of phase and/or amplitude-modulated signals.

PRIOR ART

It is known to use Injection-Locked Oscillators, or ILO, to carry out simple phase modulations such as the PSK modulation or "Phase-Shift Keying", and in particular QPSK or "Quadrature Phase-Shift Keying". Document [1] proposes in particular the production of QPSK modulators comprising quadrature oscillators, and document [2] proposes the production of QPSK modulators comprising ring oscillators. In these documents, the modulation is applied to the carrier generated by the oscillator. The modulation is obtained by injecting pulses into various internal terminals of the oscillator according to the phase shift required for each symbol. The advantage of these oscillators is that it is possible to recover the four phases necessary for QPSK modulation. In document [1], the signal obtained at the output is in the form of pulses in order to reduce the power consumption of the device, and the multiplication factor between the output signal RF and the clock signal is of the order of 41 in the highest case. In document [2], the signal obtained at the output is continuously modulated and the multiplication factor between the output signal and the clock signal is 18.

The document [3] also describes carrying out a QPSK modulation using ILOs. The phase shift is generated using the principle that the phase between the output and input of an ILO depends on the difference between the input frequency and the auto-oscillation frequency of the ILO. By changing the auto-oscillation frequency of the ILO, the phase of the output is changed. The baseband signal is used in this way to generate some of the phases of the QPSK modulation, but for some of the symbols it is also necessary to invert the outputs of the ILO because the modification of the output phase via the change of the auto-oscillation frequency of the ILO can only cover a limited phase shift range. The inversion of the ILO outputs is performed by an auxiliary circuit. This document presents a complete transmitter combining the ILO with a switched power amplifier (PA).

Document [4] describes a transmitter slightly different from that described in document [3], which does not include an auxiliary phase inversion circuit. In this transmitter, the baseband signal is used to change the frequency of the ILO and accumulate sufficient phase shift after each symbol to generate one of the four phases required for QPSK modulation of the next symbol.

Document [5] proposes the generation of a QPSK modulation based on an Injection-Locked Frequency Divider (ILFD) oscillator. In this document, the fact that the ILFD also divides the phase is used and makes it easier to generate a multiple phase shift of 90° at the output with phase shifts multiplies of 180° at the input. The proposed circuit therefore uses a polarity reversal circuit at the ILO input that divides by two to implement QPSK modulation from the baseband signal.

In documents [1] to [5], different properties of ILOs are used and the modulations are obtained by injection signal modification mechanisms which act inside the ILO circuit (for documents [1] and [ 2]), or on the input (for documents [4] and [5]) or both on the input and the output (for document [3]). On the other hand, the solutions proposed in documents [1] to [5] are only capable of generating constant amplitude modulations of the BPSK or QPSK type because they act only on the phase of the oscillation.

Document [6] proposes the use of two levers on an ILO to implement phase and amplitude modulation. The implemented modulation includes 16 symbols, constructed with 8 different phases comprised between 0° and 215° in 45° intervals and two amplitude levels. The generation of the phase is done through n signals in the same way as in document [3], that is to say by acting on the auto-oscillation frequency of the ILO and on a phase inverter at its output. The amplitude control is done by acting on signals obtained on bias sources of the negative resistance part and the injection transistors of the ILO. This technique therefore also requires acting on the internal structure of the ILO to generate the modulation.

The techniques described in documents [1] to [6] have limitations. Those which are based on a modification of the auto-oscillation frequency of the ILO are affected by the impact of variations related to the method for producing the ILO components and of temperature variations, which will modify the auto-oscillation frequency and which will require calibration to ensure correct generation of the symbol constellation (phase states). Furthermore, the techniques that rely on phase shifting the injection signal or on injection at different locations of the ILO can only be used for the generation of phase modulations, but not amplitude modulation. The only technique that allows to implement phase and amplitude modulation uses a technique for modifying the auto-oscillation frequency of the ILO for the phase and controlling the bias current for the amplitude, with a fairly complex set of control signals derived from the baseband bit stream applied to different locations of the ILO.

DESCRIPTION OF THE INVENTION

There is therefore a need to provide a phase and/or amplitude modulation device which produces direct modulation of the carrier by the digital baseband signal and which does not have the disadvantages of the prior art.

For this purpose, an amplitude modulation device is proposed with $2^P$ different amplitude states and P integer greater than or equal to 1, comprising at least:

several TORP signal generators, each TORP signal corresponding to oscillation trains periodically repeated at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, each of the TORP signal generators including at least:

an oscillator capable of generating a periodic frequency signal $F_{OL}$, and a power supply circuit configured to be controlled by a periodic power supply control signal of frequency $F_{PRP}$ and connected to at least one power supply input of the oscillator as it generates, when the TORP signal generator is intended to generate an oscillation train, a power supply voltage of the oscillator which is non-zero only during part of a period $1/F_{PRP}$, a generator of a thermometric code signal coded on at least $2^P$ bits and coding an amplitude modulation signal from an information signal comprising data symbols to be coded, a control circuit for the TORP signal generators, configured to apply or not, to a control input of the power supply circuit of each of the TORP signal generators, a periodic signal of frequency $F_{PRP}$ according to the value of each of the bits of the thermometric code signal, thus coding the data symbols in the power supply control signal, and a processing circuit comprising inputs coupled to outputs of TORP signal generators, and configured to produce a linear combination of signals applied on its inputs.

A phase and/or amplitude modulation device is also described, comprising at least one TORP signal generator corresponding to periodically repeated oscillations trains at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, the TORP signal generator including at least:

an oscillator capable of generating a periodic signal of frequency $F_{OL}$, and a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$, further including, when the modulation device is configured to perform a phase modulation or a phase and amplitude modulation, at least one generator of a phase-modulated periodic signal of frequency $F_{PRP}$ comprising at least one output on which the phase-modulated periodic signal of frequency $F_{PRP}$ is intended to be outputted and coupled to a control input of the power supply circuit, and/or including at least, when the modulation device is configured to perform an amplitude modulation or a phase and amplitude modulation with $2^P$ different amplitude states, with P integer greater than or equal to 1:

$2^P$ TORP signal generators, a generator of a thermometric code signal coded on at least $2^P$ bits and coding an amplitude modulation signal, a control circuit for the $2^P$ TORP signal generators, configured to apply or not, to the control input of the power supply circuit of each of the $2^P$ TORP signal generators, the periodic signal of frequency $F_{PRP}$ according to the value of each of the $2^P$ bits of the thermometric code signal, and a processing circuit comprising at least $2^P$ inputs coupled to outputs of the $2^P$ TORP signal generators, and configured to produce a linear combination of signals applied on its $2^P$ inputs.

In this device, each TORP signal generator performs a frequency synthesis generating a high frequency signal ($F_{OL}$) from another lower frequency signal ($F_{PRP}$), these low and high frequencies being proportional and related by a high multiplier factor (for example a few tens).

For amplitude modulation, this device is based on the control of several TORP signal generators by the same signal, these generators being synchronized with the same signal and phase coherent with each other by construction. The modulation technique is much simpler than in the devices of the prior art because it only uses a single input signal and does not require control within the TORP signal generators.

The oscillator of each of the TORP signal generators is such that the frequency $F_{OL}$ is equal to $N \cdot F_{PRP}$, with N integer greater than or equal to 2. $F_{OL}$ therefore corresponds to a frequency of one of the harmonics of the output signal spectrum of the device, and advantageously the central harmonic of the output signal spectrum of the device in order to maximize the amplitude of the signal at the frequency $F_{OL}$.

In a particular configuration, the device may include $2^P$ TORP signal generators, the thermometric code signal being in this case coded on $2^P$ bits such that, regardless of the value of the information signal, one of the bits of the thermometric code signal has a value different from that of the other bits of the thermometric code signal.

The modulation device may be configured to perform a phase and amplitude modulation and may further include at least one generator of a phase-modulated periodic signal of frequency $F_{PRP}$, the control circuit for the TORP signal generators being configured to apply or not, to the control input of the power supply circuit of each of the TORP signal generators, the phase-modulated periodic signal of frequency $F_{PRP}$ depending on the value of each of the bits of the thermometric code signal. Such a configuration allows to perform complex modulations which have the advantage of being more resistant to radiofrequency, or RF, imperfections, such as phase noise.

In the case of phase and amplitude modulation, the generated high-frequency signal is used as a carrier, or carrier signal, and includes, from its generation, the phase modulation information. Because the frequency synthesis generating the carrier and the modulation of this carrier are performed directly from a digital baseband signal, it is not necessary to use analog-to-digital converters and IQ mixers to achieve the frequency conversion of the baseband signal to the high frequency, which allows to reduce the consumption of the device.

The control circuit for the TORP signal generators may include several AND gates each configured to receive on a first input one of the bits of the thermometric code signal and on a second input the periodic signal of frequency $F_{PRP}$, the outputs of the AND gates on which are outputted the power supply control signals which can be coupled to the control inputs of the power supply circuits of the TORP signal generators.

When the modulation device is configured to carry out a phase and amplitude modulation, the generator of the phase-modulated periodic signal of frequency $F_{PRP}$ may be configured to apply, to a periodic signal of frequency $F_{PRP}$, and for each symbol to be coded, a delay corresponding to a multiple of $1/(2^X \cdot F_{OL})$, allowing to perform a phase modulation with $2^X$ different phase states, X being an integer greater than or equal to 1.

When the modulation device is configured to perform a phase and amplitude modulation, the generator of the phase-modulated periodic signal of frequency $F_{PRP}$ may be configured to apply, over one or more periods of a periodic signal of frequency $F_{PRP}$, a delay corresponding to the symbol to be coded. The number of periods of the periodic signal of frequency $F_{PRP}$ dedicated to one symbol is selected in particular depending on the desired modulation rate.

When the modulation device is configured to perform a phase and amplitude modulation with $2^X$ different phase states, the generator of the phase-modulated periodic signal of frequency $F_{PRP}$ may include at least:

a delay locked loop configured to receive as input a periodic signal of frequency $F_{PRP}$, and a multiplexer comprising $2^X$ inputs coupled to different delay cells of the delay locked loop and on which $2^X$ periodic signals of frequency $F_{PRP}$ delayed differently from each other are obtained, a control input on which a phase modulation signal determining the phase state to be applied for each symbol is intended to be applied, and an output on which the phase-modulated periodic signal of frequency $F_{PRP}$ is intended to be outputted, X being an integer greater than or equal to 1.

When $F_{OL}=N \cdot F_{PRP}$, with N integer greater than or equal to 2, the modulation device may be such that:

each delay cell applies a delay $\Delta T_1=1/(2^X \cdot N \cdot F_{PRP})$, or $2^X$ delay cells each apply a delay $\Delta T_1=1/(2^X \cdot N \cdot F_{PRP})$, the other delay cells of the delay locked loop apply a delay $\Delta T_2 > \Delta T_1$, or each delay cell applies a delay $\Delta T_3=1/(4 \cdot N \cdot F_{PRP})$.

The generator of the thermometric code signal may be configured to receive as input a binary amplitude modulation signal coding on P bits one of $2^P$ different amplitude states, and to convert the binary amplitude modulation signal into a thermometric code signal.

The processing circuit may correspond to an adder.

The power supply circuit of each of the TORP signal generators may include at least one controlled switch.

A phase modulation device is also proposed, comprising at least one TORP signal generator corresponding to oscillation trains periodically repeated at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, the TORP signal generator including at least:

an oscillator capable of generating a periodic signal of frequency $F_{OL}$, and a power supply circuit configured to be controlled by a periodic power supply control signal of frequency $F_{PRP}$ and connected to at least one power supply input of the oscillator as it generates, when the TORP signal generator is intended to generate an oscillation train, a power supply voltage of the oscillator which is non-zero only during part of a period $1/F_{PRP}$, the device further including a generator of a phase-modulated periodic signal of frequency $F_{PRP}$, coding data symbols of an information signal, comprising at least one output on which the phase-modulated periodic signal of frequency $F_{PRP}$ is intended to be outputted and coupled to a control input of the power supply circuit.

An amplitude modulation method is also proposed with $2^P$ different amplitude states and P integer greater than 1, implemented with an amplitude modulation device comprising several TORP signal generators corresponding to oscillations trains periodically repeated at a frequency $F_{PRP}$ whose oscillations are of frequency $F_{OL}$ equal to $N \cdot F_{PRP}$, with N integer greater than or equal to 2, and each oscillations train of which has a duration of less than $1/F_{PRP}$, each of the generators including at least:

an oscillator capable of generating a periodic signal of frequency $F_{OL}$, and a power supply circuit configured to be controlled by a periodic power supply control signal of frequency $F_{PRP}$ and connected to at least one power supply input of the oscillator as it generates, when the TORP signal generator is intended to generate an oscillation train, a power supply voltage of the oscillator which is non-zero only during part of a period $1/F_{PRP}$, wherein the method comprises at least the following steps:

generation of a thermometric code signal coded on at least $2^P$ bits and coding an amplitude modulation signal from an information signal comprising data symbols to be coded, application or not, depending on the value of each of the bits of the thermometric code signal, of a periodic signal of frequency $F_{PRP}$ on a control input of the power supply circuit of each of the TORP signal generators, thus coding the data symbols in the power supply control signal, and linear combination of the signals outputted by the TORP signal generators.

A phase and/or amplitude modulation method is also described, comprising at least, when the method performs a phase modulation:

generation of a phase-modulated periodic signal of frequency $F_{PRP}$;

application of the phase-modulated periodic signal of frequency $F_{PRP}$ to a control input of a TORP signal generator corresponding to oscillation trains periodically repeated at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, the TORP signal generator including at least:

an oscillator capable of generating a periodic signal of frequency $F_{OL}$, and a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$, or including at least, when the modulation device is configured to perform an amplitude modulation with $2^P$ different amplitude states, with P integer greater than or equal to 1:

generation of a thermometric code signal coded on at least $2^P$ bits and coding an amplitude modulation signal, application or not, depending on the value of each of the $2^P$ bits of the thermometric code signal, of the periodic signal of frequency $F_{PRP}$ to each of the control inputs of $2^P$ TORP signal generators, each TORP signal generator including at least:

an oscillator capable of generating a periodic signal of frequency $F_{OL}$, and a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$, linear combination of the signals outputted by the $2^P$ TORP signal generators, or including at least, when the modulation device is configured to perform an amplitude and phase modulation with $2^P$ different amplitude states, with P integer greater than or equal to 1:

generation of a phase-modulated periodic signal of frequency $F_{PRP}$;

generation of a thermometric code signal coded on at least $2^P$ bits and coding an amplitude modulation signal, application or not, depending on the value of each of the $2^P$ bits of the thermometric code signal, of the phase-modulated periodic signal of frequency $F_{PRP}$ to each of the control inputs of $2^P$ TORP signal generators, each TORP signal generator including at least:

an oscillator capable of generating a periodic signal of frequency $F_{OL}$, and a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$, linear combination of the signals outputted by the $2^P$ TORP signal generators.

The method may perform a phase and amplitude modulation, and may further include a generation of a phase-modulated periodic signal of frequency $F_{PRP}$, the step of applying the periodic signal of frequency $F_{PRP}$ being able to be implemented with the phase-modulated periodic signal of frequency $F_{PRP}$.

BRIEF DESCRIPTION OF THE DRAWINGS

The present invention will be better understood upon reading the description of exemplary embodiments given in a purely indicative and non-limiting manner with reference to the appended drawings wherein.

Identical, similar or equivalent parts of the various figures described below carry the same reference numerals so as to facilitate the passage from one figure to another.

The different parts shown in the figures are not necessarily on a uniform scale, to make the figures more readable.

The different possibilities (variants and embodiments) should be understood as not being mutually exclusive and can be combined with each other.

DETAILED DESCRIPTION OF PARTICULAR EMBODIMENTS

Figure 1:
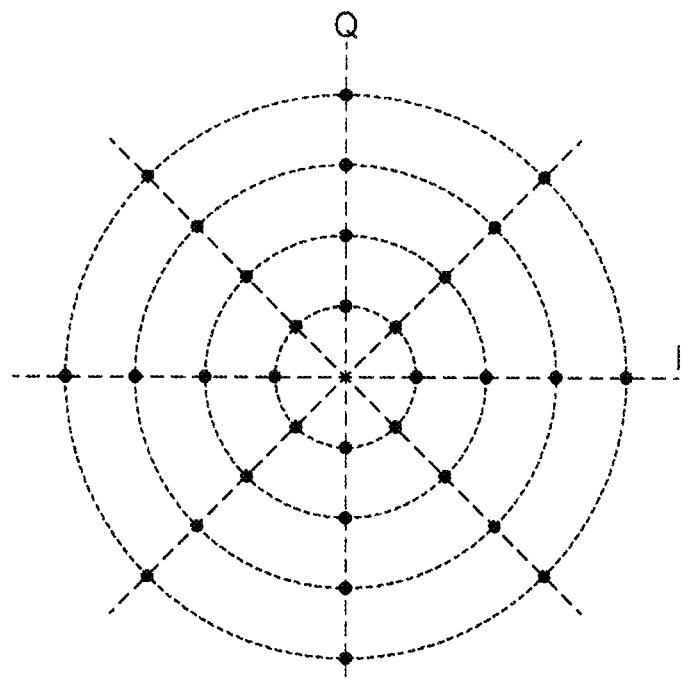
FIGS. 1 and 2A-2D show examples of IQ diagrams of phase and amplitude modulations.

Phase and amplitude modulations, also called polar or complex modulations, comprise a number of phase states and amplitude states wherein the modulated signal is located and which can be shown by points distributed in an IQ diagram, or polar diagram or constellation diagram, each of these points representing a modulation state wherein the carrier can be modulated. A $2^X \times 2^P$ polar modulation includes $2^X$ possible phase states and $2^P$ possible amplitude states. Such a $2^X \times 2^P$ polar modulation has a spectral efficiency of X+P bits per Hz and includes a total of $2^{X+P}$ symbols. FIG. 1 shows, in an IQ diagram, the 32 possible symbols of a $2^3 \times 2^2$ (X=3, P=2) polar modulation. Each point visible on this diagram corresponds to a possible modulation state, that is to say one of the 32 possible symbols.

Figure 2A:
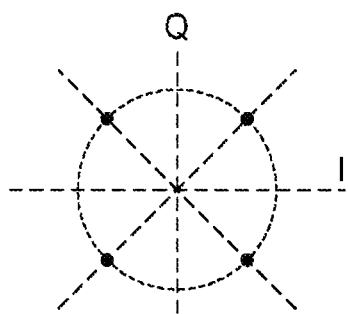
Figure 2B:
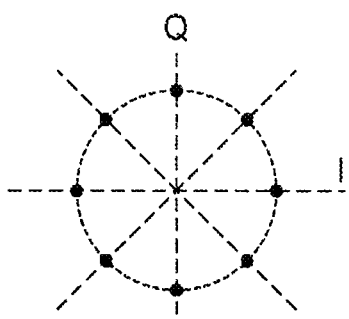
Figure 2C:
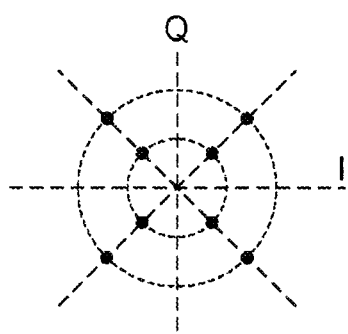
Figure 2D:
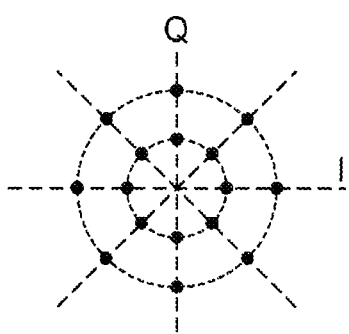

FIGS. 2A to 2D respectively show the particular polar modulation IQ diagrams, namely the QPSK modulation (X=2, P=0) visible in FIG. 2A, the 8PSK modulation (X=3, P=0) visible in FIG. 2B, the $2^2 \times 2^1$ polar modulation visible in FIG. 2C, and the $2^3 \times 2^1$ polar modulation visible in FIG. 2D.

Figure 3:
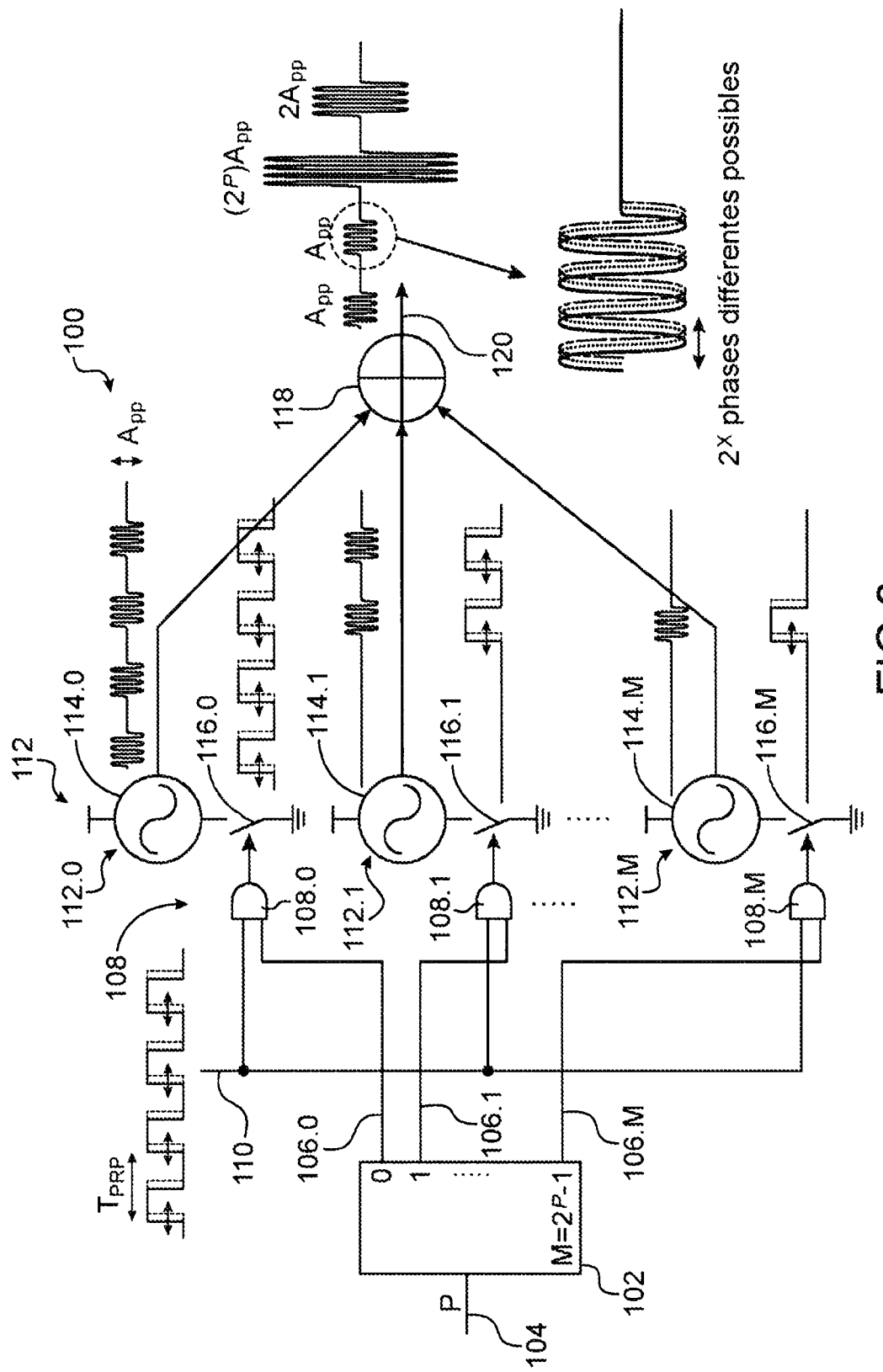
FIG. 3 shows a phase and/or amplitude modulation device according to a particular embodiment.

FIG. 3 schematically shows a phase and amplitude modulation device 100 according to a particular embodiment. In this particular embodiment, the device 100 is configured to perform a phase and amplitude modulation of the $2^X \times 2^P$ type.

The device 100 includes a thermometric code signal generator 102 coded on $2^P$ bits and coding an amplitude modulation signal. In the particular embodiment described here, the generator 102 includes an input 104 on which an amplitude modulation signal coded on P bits is received. The amplitude modulation signal carries the piece of information relating to the amplitude modulation to be applied to the signal to be modulated and codes on P bits one of the $2^P$ possible amplitude states for each data symbol to be coded in the signal to be modulated. The generator 102 is configured to convert the binary amplitude modulation signal into a thermometric code signal coded on $2^P$ bits. The generator 102 includes $2^P$ outputs 106, referenced 106.0 to 106.M (with M=$2^P$-1) in FIG. 3, on which the $2^P$ bits of the thermometric code signal are outputted. For example, for a binary amplitude modulation signal coded on 3 bits, the binary code 000 corresponds to the thermometric code 00000001, the code 001 to the code 00000011, the code 010 to the code 00000111, and so on up to the binary code 111 which corresponds to the thermometric code 11111111.

The binary amplitude modulation signal codes each of the amplitude states to be applied to the modulated signal on P bits. After the conversion performed by the generator 102, each of these amplitude states is coded on the $2^P$ bits outputted on the outputs 106 of the generator 102.

The device 100 also includes $2^P$ AND gates, referenced 108.0 to 108.M in FIG. 3. Each of the AND gates 108.0-108.M includes two inputs, a first one of these two inputs being connected to one of the $2^P$ outputs 106.1-106.M of the generator 102 and a second one of these two inputs being connected to a power line 110 on which is outputted a periodic signal of frequency $F_{PRP}$, corresponding for example to a square signal.

In the particular embodiment described here, the device 100 is intended to achieve a phase and amplitude modulation. The signal outputted on the power line 110 includes the phase modulation information, and is therefore phase-modulated, that is to say is periodically delayed such that its phase codes one of $2^X$ possible phase states for each symbol of the modulated signal. To facilitate the understanding of the invention, an example of a phase-modulated periodic signal of frequency $F_{PRP}$ is symbolically shown in FIG. 3 next to the line 110.

The device 100 also includes several, here $2^P$, TORP signal generators 112 corresponding to oscillation trains periodically repeated at the frequency $F_{PRP}$, the oscillations of which are of frequency $F_{OL}$ equal to $N \cdot F_{PRP}$, with N integer greater than or equal to 2, and each oscillation train of which has a duration of less than $1/F_{PRP}$, referenced 112.0 to 112.M in FIG. 3. Each of the TORP signal generators 112.0-112.M includes an oscillator 114, referenced 114.0-114.M in FIG. 3, capable of generating a periodic signal of frequency $F_{OL}$. According to an exemplary embodiment, each oscillator 114.0-114.M is of the VCO type and is voltage controlled by a control signal $V_{ctrl}$ (not visible in FIG. 3). Each of the TORP signal generators 112.0-112.M also includes a power supply circuit 116.0-116.M configured to be controlled by a periodic power supply control signal of frequency $F_{PRP}$ which corresponds to the signal obtained at the output of one of the AND gates 108.0-108.M. The power supply circuits 116.0-116.M electrically power the oscillators 114.0-114.M and are each connected to a power supply input of each of the oscillators 114.0-114.M. The power supply circuits 116.0-116.M generate power supply voltages of the oscillators 114.0-114.M which are non-zero only during part of each period $T_{PRP}=1/F_{PRP}$. In the example of FIG. 3, each of the power supply circuits 116.0-116.M includes a switch interposed between a power supply input of one of the oscillators 114.0-114.M and a reference electric potential.

In FIG. 3, in order to facilitate the understanding of the invention, examples of signals obtained at the output of the AND gates 108 and examples of signals outputted by the generators 112 are shown.

In the exemplary embodiment of FIG. 3, the power supply control signals of TORP signal generators 112 which are applied to the control inputs of the power supply circuits 116.0-116.M are outputted by the AND gates 108.0-108.M which represent a particular exemplary embodiment. More generally, the device 100 includes a control circuit 108 of the $2^P$ TORP signal generators 112, configured to perform AND logic functions between each of the $2^P$ bits of the thermometric code signal and the periodic frequency signal $F_{PRP}$ applied to the input of the control circuit 108, and configured to apply, to the control input of the power supply circuit 116.0-116.M of each of the $2^P$ TORP signal generators 112, each of the power supply control signals obtained at the output of the AND logic functions.

The AND gates 108.0-108.M shown in FIG. 3 correspond to a particular exemplary embodiment of the control circuit 108. Alternatively, the control circuit 108, which allows to apply or not to the control input of the power supply circuit 116.0-116.M of each of the $2^P$ TORP signal generators 112.0-112.M the periodic signal of frequency $F_{PRP}$ according to the value of each of the $2^P$ bits of the thermometric code signal, can be produced with other logical or electronic structures which lets through or bars a signal between an input and to an output according to a second control input from the generator 102.

The outputs of the oscillators 114.0-114.M, that is to say the outputs of the $2^P$ TORP signal generators 112.0-112.M, are connected to the inputs, here $2^P$ in number, of a processing circuit 118 which performs a coherent linear combination of the signals applied to its inputs and which outputs at its output 120, forming the output of the device 100, a signal corresponding to the coherent linear combination of the signals outputted by the oscillators 114.0-114.M. For example, as shown in the example of FIG. 3, circuit 118 may correspond to an adder. It is also possible that the processing circuit 118 performs a multiplication of the signals applied to its inputs by a variable, which however requires the presence of a variable amplifier.

In FIG. 3, in order to facilitate the understanding of the invention, an example of a phase and amplitude-modulated signal obtained at the output of the device 100 is shown.

In the device 100, the phase modulation is generated by a phase shift of the signal used to control the generation of the TORP signals by the generators 112.0-112.M, and the amplitude modulation is carried out by the coherent combination of the TORP signals outputted at the output of the generators 112.0-112.M which are synchronised by the same control signal which is phase-modulated. The linear combination carried out by the processing circuit 118 is coherent because it preserves the phase modulation applied to the TORP signals outputted by the generators 112.0-112.M. Thus, during the operation carried out by the processing circuit 118, the TORP signals from which the coherent linear combination is carried out are in phase with each other, and the phase information is in the signal obtained on the output 120.

Figure 4:
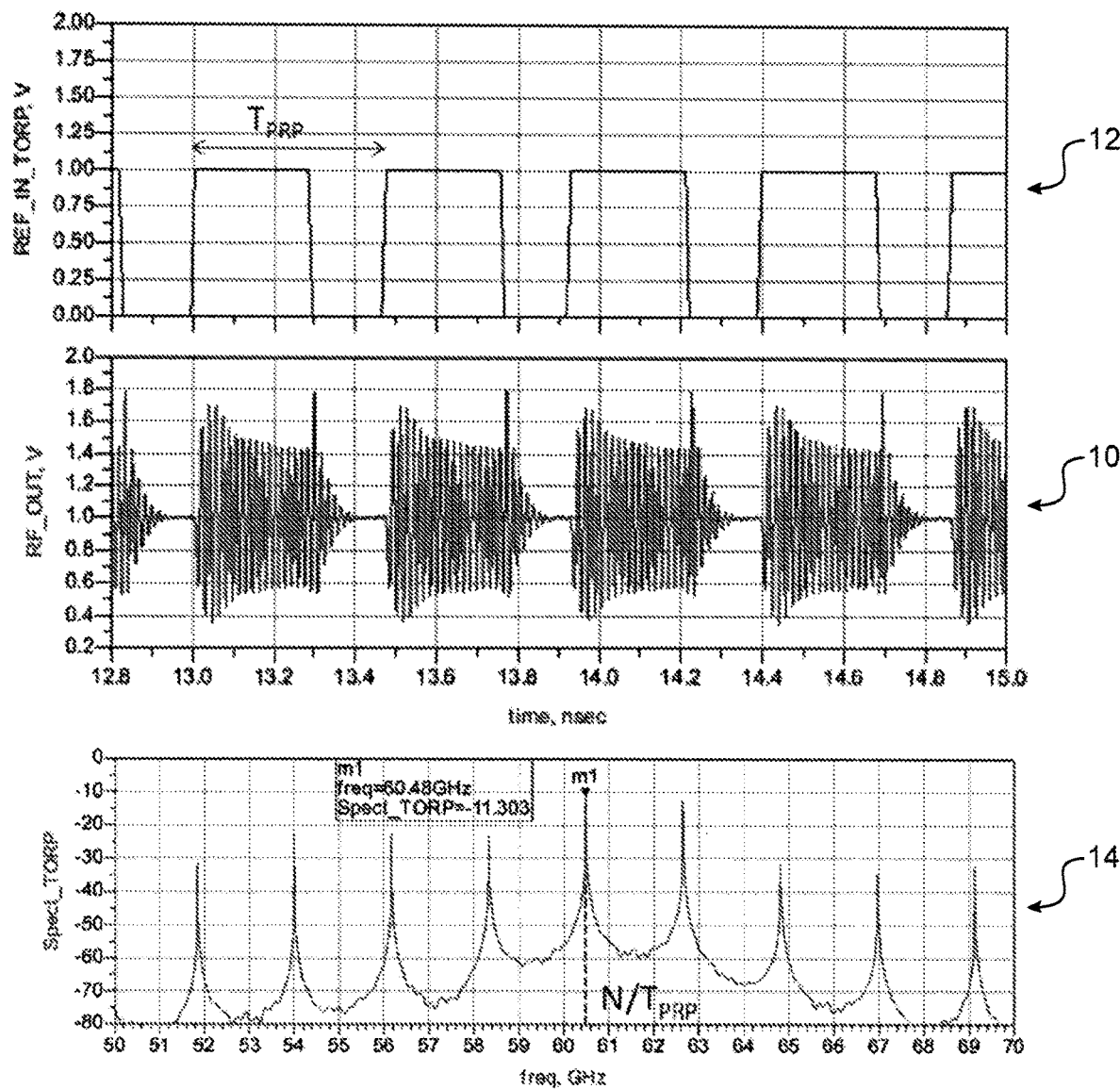
FIG. 4 shows examples of signals used and obtained in a TORP signal generator.

FIG. 4 shows the TORP signal (which carries the reference 10) obtained at the output of one of the generators 112.0-112.M when this generator is controlled by a square signal of period $T_{PRP}$ (which carries the reference 12) not including phase modulation information. The output signal 10 obtained corresponds to a pulsed signal formed of oscillation trains at the free oscillation frequency of the oscillator 114, corresponding to $F_{OL}$, these oscillations being periodically repeated at the frequency $F_{PRP}$ of the control signal applied to the input of the TORP signal generator. Each oscillation train has a duration of less than $1/F_{PRP}$, which means that the control signal has a duty cycle of less than 100%.

In this FIG. 4, the power supply control signal 12 does not include a phase shift, unlike what is achieved in the device 100 when a phase modulation or a phase and amplitude modulation is implemented. The reference 14 designates the spectrum of the output signal 10. This figure illustrates the relationship obtained between the periods, and therefore between the frequencies, of the power supply control signal 12 and of the output signal 10 in such a generator 112. In the example of this FIG. 4, the value of $1/T_{PRP}$, that is to say the frequency of the power supply control signal 12, is equal to 2.16 GHz, and the power supply control signal 12 has a duty cycle equal to 65%. When the power supply control signal 12 is not phase-modulated, the spectrum of the output signal 10 is composed of a comb of harmonic terms advantageously located at frequencies which are integer multiples of the input frequency $1/T_{PRP}$, that is to say $1/T_{PRP}$, $2/T_{PRP}$, ..., $(N-1)/T_{PRP}$, $N/T_{PRP}$, $(N+1)/T_{PRP}$, etc. N corresponds to the multiplication factor between the frequency $F_{PRP}$ of the power supply control signal 12 and the central term of the spectrum of the TORP signal 10. The frequency term equal to $N/T_{PRP}$ corresponds to the one having the greatest amplitude and it is around the auto-oscillation frequency of the generator 112. In the example of FIG. 4, N=28.

The detailed operation of the generator 112 is described in document EP 2 786 492 B1 or in document EP 2 966 784 B1. The various variant embodiments of the TORP signal generator described in document EP 2 786 492 B1 or in document EP 2 966 784 B1 can be applied for the production of the generators 112 of the device 100 described here.

Figure 5:
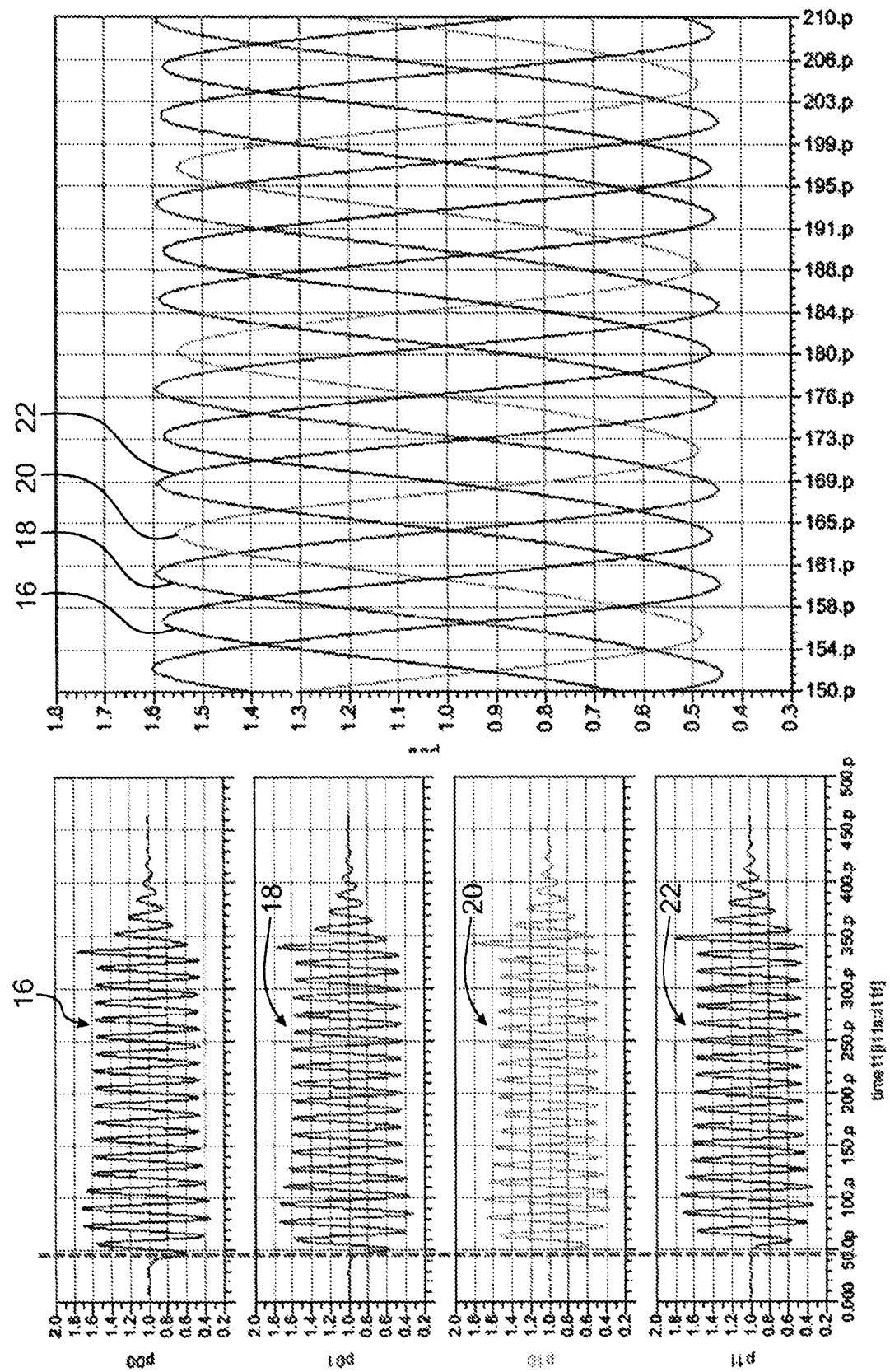
FIG. 5 shows examples of phase-shifted signals obtained at the output of several TORP signal generators.

To apply the phase modulation to the power supply control signals of the generators 112.0-112.M, the power supply control signals are periodically delayed by a value corresponding to the desired phase modulation state. For example, when the device 100 carries out a $2^2 \times 2^P$ polar modulation such as a QPSK modulation, that is to say including four phase states, the phase shift applied corresponds to one of the following four values: 0°, 90°, 180°, and 270°. These values correspond to delays of 0, ¼, ½, and ¾ of the period of the carrier, that is to say of a sinusoidal signal of frequency $F_{OL}$ or $N/T_{PRP}$ in the particular embodiment described here. These phase shifts can therefore be generated by time-shifts of the control signal with a duration equal to 0, $T_{PRP}/4N$, $2T_{PRP}/4N$, and $3T_{PRP}/4N$. FIG. 5 shows examples of TORP signals delayed by a duration equal to 0 (signal referenced 16), $T_{PRP}/4N$ (signal referenced 18), $2T_{PRP}/4N$ (signal referenced 20), and $3T_{PRP}/4N$ (signal referenced 22).

The phase modulation may be done on each period of the power supply control signals of the generators 112.0-112.M or at a frequency less than that of the control signals. In other words, a different phase state, corresponding to a different symbol, may be applied to each period of the power supply control signals of the generators 112.0-112.M, or the same phase state of a single symbol can be applied to several periods, for example two or three periods, of the power supply control signals of the generators 112.0-112.M. This frequency with which the phase modulation is applied to the power supply control signals of the generators 112.0-112.M can be expressed in terms of the number of pulses, or number of oscillation trains, per symbol (or phase state), which represents the number of pulses or oscillation trains of each power supply control signal to which each phase state is applied. All the pulses, or all the oscillation trains, of the power supply control signals of the generators 112.0-112.M associated with the same symbol therefore have the same phase. The modulation rate of the device 100 therefore corresponds to a fraction of the frequency of the power supply control signal of the generators 112.0-112.M, the value of which depends on the number of pulses or oscillation trains per symbol, with an upper limit corresponding to the value of the frequency of the power supply control signal of the generators 112.0-112.M (upper limit which corresponds to the case where a phase state of a symbol is applied to a single pulse or a single oscillation train of the control signals of the generators 112.0-112.M).

For example, if $1/T_{PRP}$=2.16 GHz and if one pulse or one oscillation train is used for each symbol, the modulation rate obtained is of 2.16 Gsymbols/s or 2.16 Gbauds/s. If the phase state of each symbol is applied to two pulses or two oscillation trains of the control signals of the generators 112.0-112.M, the modulation rate obtained is then of 1.08 Gsymbols/s or 1.08 Gbaud/s.

Figure 6:
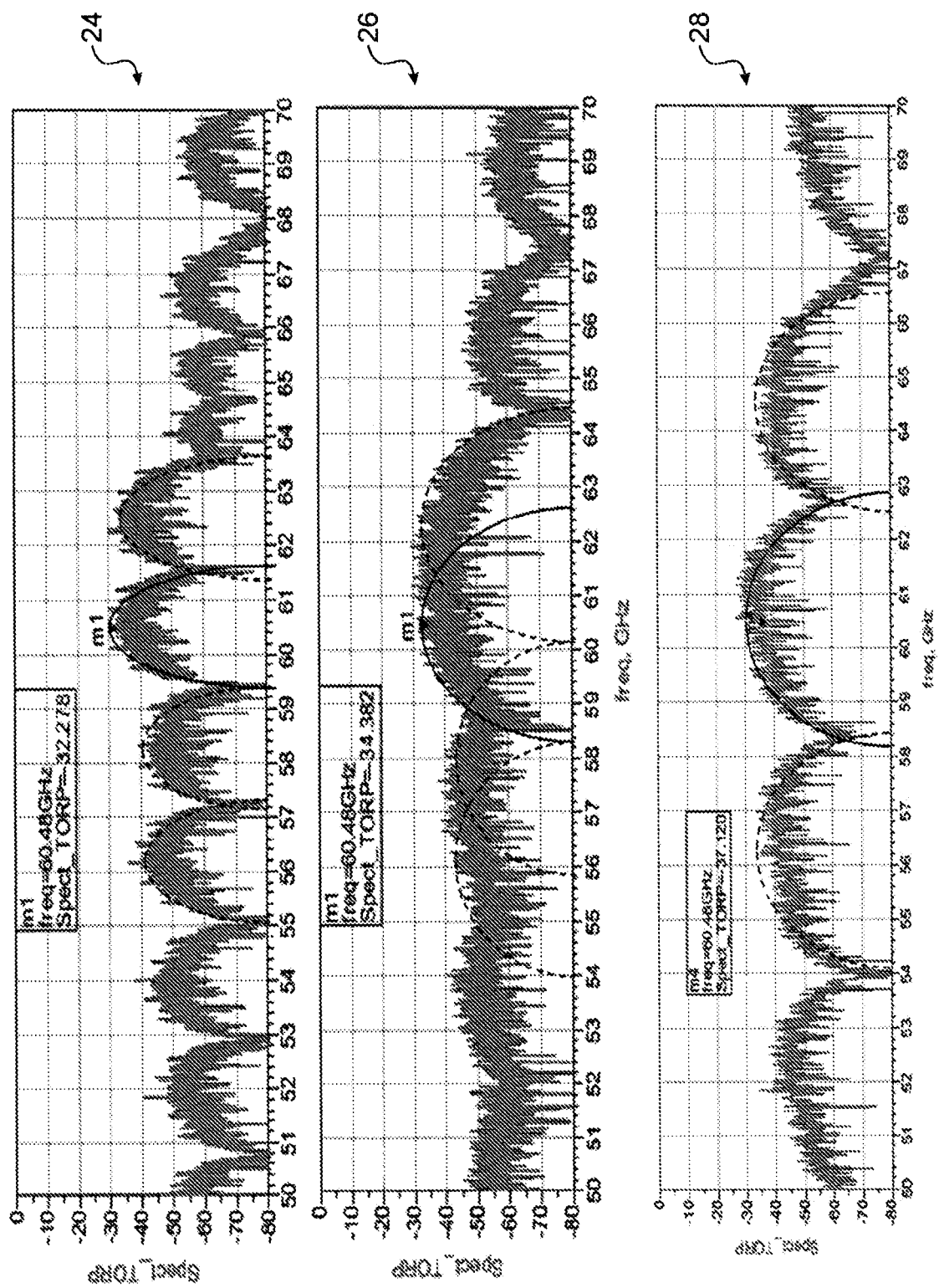
FIG. 6 shows three spectra of three TORP signals which are phase modulated differently.

FIG. 6 shows three spectra of phase-modulated TORP signals obtained with different phase modulation parameters. The spectrum referenced 24 corresponds to the case where the frequency of the phase modulation is such that one pulse or one oscillation train is used for each symbol, with $1/T_{PRP}$=2.16 GHz and $N/T_{PRP}$=60.48 GHz, with 4 different possible phase states. On spectrum 24, the modulation of harmonics adjacent to the central harmonic (at the frequency $N/T_{PRP}$) extends into the frequency band of the modulation on the central harmonic. The spectrum referenced 26 corresponds to the case where the frequency of the phase modulation is such that two pulses or two oscillation trains are used for each symbol, with $1/T_{PRP}$=2.16 GHz and $N/T_{PRP}$=60.48 GHz, and with 4 different possible phase states. The spectrum referenced 28 corresponds to the case where the frequency of the phase modulation is such that two pulses or two oscillation trains are used for each symbol, with $1/T_{PRP}$=4.32 GHz and $N \times 1/T_{PRP}$=60.48 GHz, and with 4 different possible phase states. In spectra 26 and 28, the modulation of harmonics adjacent to the central harmonic does not extend into the frequency band of the central harmonic modulation. Thus, to avoid overlap between the frequency bands of the harmonics, it is possible to increase the frequency of the control signal and/or the number of pulses, or oscillation trains, per symbol to keep the same bit rate and space the frequencies of the harmonics adjacent to the central harmonic.

Figure 7A:
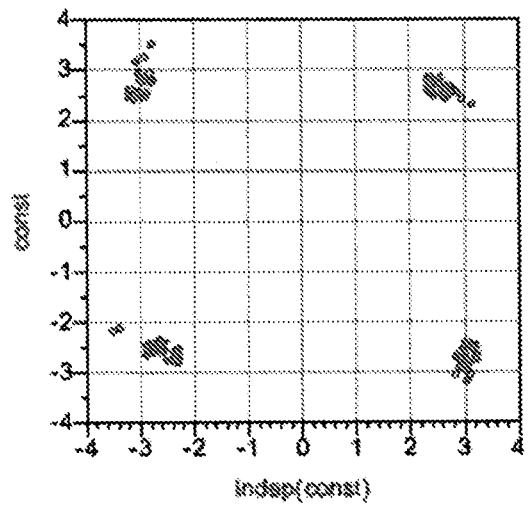
FIGS. 7A and 7B show IQ diagrams of a QPSK modulation carried out with the phase and/or amplitude modulation device according to the invention, with different phase modulation parameters.
Figure 7B:
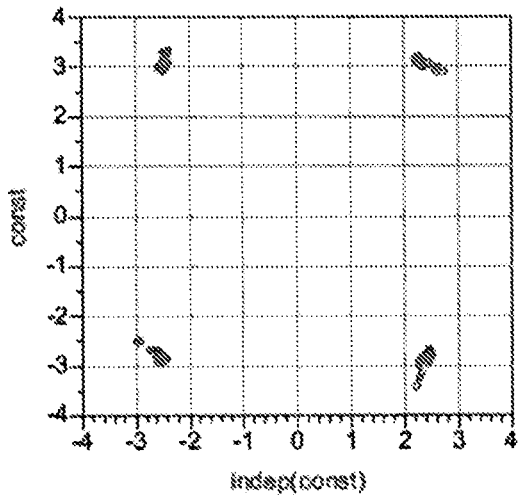

FIG. 7A shows the IQ diagram of a QPSK modulation carried out with the device 100, with one pulse or one oscillation train used for each symbol, $1/T_{PRP}$=2.16 GHz and a bit rate of 2.16 Gbauds/s. FIG. 7B shows the IQ diagram of a QPSK modulation carried out with the device 100, with two pulses or two oscillation trains used for each symbol, $1/T_{PRP}$=4.32 GHz and a bit rate of 2.16 Gbauds/s. These diagrams show that a lower dispersion of the modulation states is obtained by increasing the number of pulses or oscillation trains used for each symbol and/or the frequency of the control signal of the generators 112.0-112.M of the device 100.

Figure 8:
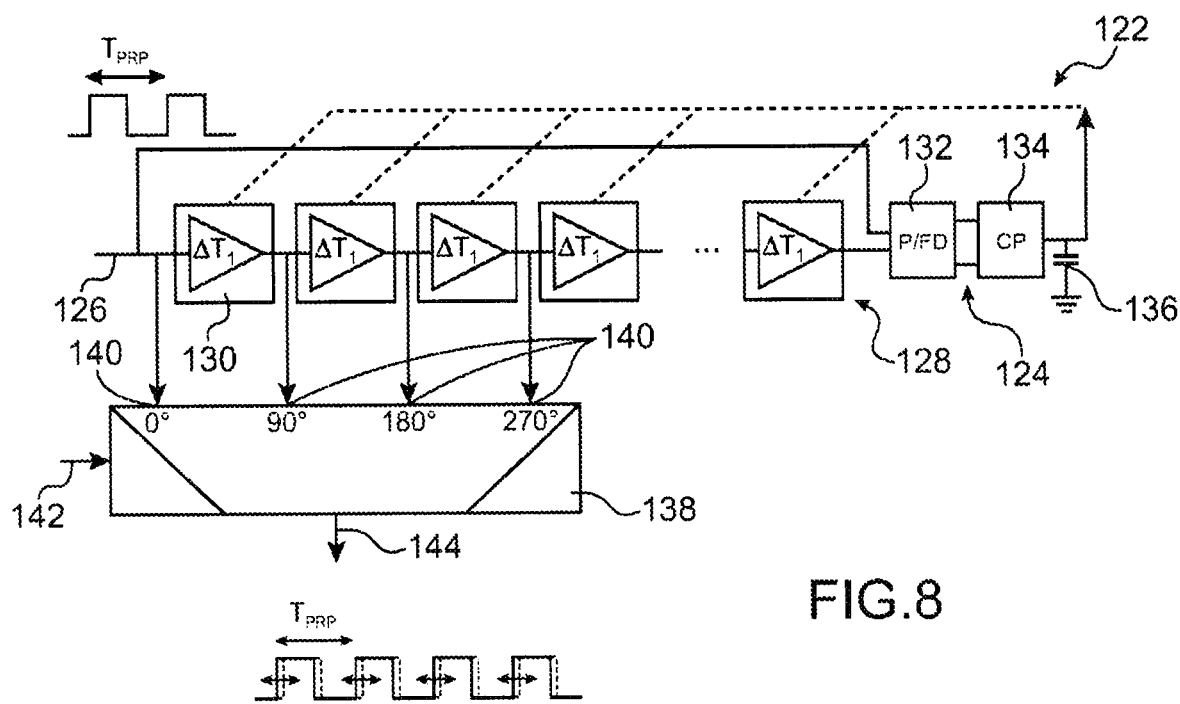
FIG. 8 shows a first exemplary embodiment of a phase-modulated periodic signal generator.

The phase shift of the power supply control signal of the generators 112.0-112.M can be achieved by a generator 122 of the phase-modulated periodic signal of frequency $F_{PRP}$. FIG. 8 shows a first exemplary embodiment of such a generator 122.

In this first exemplary embodiment, the generator 122 includes a delay locked loop 124. This loop 124 includes an input 126 to which a periodic signal, for example a square signal, the frequency of which determines the value of $F_{PRP}$, is applied. The loop 124 includes a delay line 128 into which the periodic signal of frequency $F_{PRP}$ is injected. The delay line 128 is formed of a plurality of delay cells 130 coupled in series to each other. The delay applied by each delay cell 130 is for example equal to $\Delta T_1 = T_{PRP}/(N \cdot 2^X)$. The total number K of cells 130 is for example $K=N \cdot 2^X$. This structure is commonly referred to as a DLL or "Delay Locked Loop". The loop 124 also includes a phase and frequency comparator 132 (P/FD) the input of which is coupled to the output of the last delay cell 130 of the line 128, a charge pump 134 (CP) the input of which is coupled to the output of the comparator 132, and a filter 136 coupled to the output of the charge pump 134 and represented by a capacitor in the example of FIG. 8. The line 128 is voltage controlled via a control voltage obtained at the output of the filter 136 and applied to a control input of each of the delay cells 130. The loop 124 therefore adjusts the delay of the cells 130, via the control voltage obtained at the output of the filter 136, to guarantee an overall delay equal to the period of the periodic signal applied to the input 126 which fixes this time at the value of $T_{PRP}$.

According to a first variant embodiment of the loop 124, it is possible that all the cells 130 do not apply the same delay. For example, it is possible that the first $2^X$ cells 130 apply the delay $\Delta T_1 = T_{PRP}/(N \cdot 2^X)$, and the other cells 130 (that is to say the remaining $K-2^X$ cells) apply a delay $\Delta T_2 > \Delta T_1$. Thus, for a given delay of the line 128, it is possible to reduce the total number of delay cells 130 allowing this delay to be obtained. In this variant, the control voltage obtained at the output of the filter 136 is processed before being applied to the control input of each of the delay cells 130. This processing of the voltage obtained at the output of the filter 136 and coming from the loop 124 varies for each cell 130 depending on the value of the delay to be applied by each cell 130. This processing can be carried out by conventional circuits for processing continuous signals (amplifiers, resistive bridges, DC/DC converters) applying, for each cell 130, a law acting on the value of the control voltage to be applied at the input of the cell 130 according to the desired value of the delay. Thus, the consumption of the loop 124 is reduced thanks to the reduction in the number of delay cells 130 forming the line 128 which allows to generate a total cumulative delay equal to a period of the signal applied to the input 126, and thanks to the reduction in the number of transitions taking place within the loop 124.

According to a second variant embodiment of the loop 124, if the product $(N \cdot 2^X)$ is a multiple of 4, it is possible to break it down into two other products such that $P \cdot 2^X/4 = N \cdot 2^X$. It is therefore possible to find $2^X$ different phases from larger delays $\Delta T_3 = T_{PRP}/P$. Thus, the cells 130 can each apply a delay $\Delta T_3$, which allows to reduce the consumption of the loop 124 because this consumption is proportional to the number of signal transitions taking place within the loop 124 over a given period of time.

The generator 122 also includes a multiplexer 138 comprising at least $2^X$ inputs 140 coupled to different outputs of the line 128 on which $2^X$ periodic signals of frequency $F_{PRP}$ delayed differently from each other, with the different delays corresponding to all the desired phase states, are obtained. The signal obtained at each output of the line 128 corresponds to a delayed version of the input signal. The multiplexer 138 includes a control input 142 to which a phase modulation control signal determining the phase state to be applied for each symbol is applied. This control signal corresponds for example to a binary signal, and allows to select the delay corresponding to the phase shift of each symbol to be applied to the carrier signal to be modulated. The multiplexer 138 includes an output 144, forming the output of the generator 122, on which the phase-modulated periodic signal of frequency $F_{PRP}$ is obtained.

The number of outputs of the line 128 applied to the inputs 140 of the multiplexer 138 is for example equal to the division of a period of the central term (central harmonic) of the output signal spectrum of one of the generators 112.0-112.M (that is to say $N/T_{PRP}$) by the number of phase states of the modulation (that is to say $2^X$).

In the example of FIG. 8, the generator 122 is adapted to perform a phase modulation with 4 phase states (X=2).

In the device 100, the routing between the output of the generator 122 and the control inputs of the power supply circuits 116.0-116.M of the generators 112 is balanced in each of the branches so that the periodic signal of frequency $F_{PRP}$ is very well synchronised at each of the control inputs of the power supply circuits 116.0-116.M of the generators 112.

In the device 100, the amplitude modulation is carried out using the property of each generator 112.0-112.M to guarantee the phase coherence between the signal applied to the control input of the power supply circuit 116.0-116.M of each generator 112.0-112.M and the signal outputted from each generator 112.0-112.M. Thus, two TORP signal generators controlled by the same input signal will generate two output signals which are phase coherent with each other and which can therefore be combined, for example added, without losing the phase information. This coherent combination mechanism generates a signal with several possible discrete amplitude values ranging from 1 to $2^P$ depending on the amplitude modulation signal.

Figure 9:
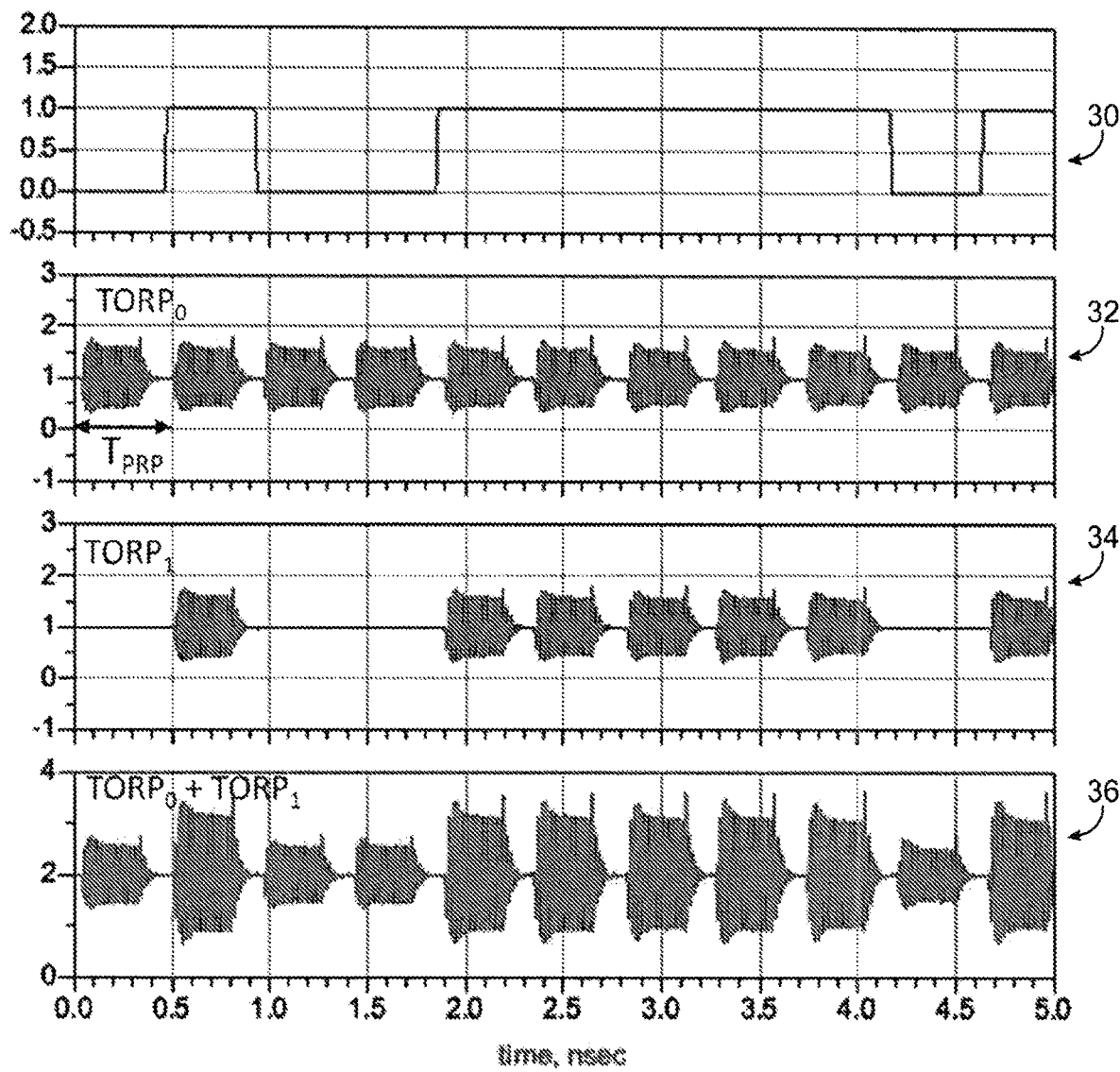
FIG. 9 shows an example of coherent addition of TORP signals.

FIG. 9 shows examples of signals obtained with the device 100 when P=1, which allows to code 1 bit of information on the amplitude of the signal obtained by the linear combination, for example the coherent addition of the two TORP signals obtained by generators 112 synchronised with the same input signal, with one of the two generators operating conditionally according to the value of the amplitude modulation signal. Reference 30 designates the amplitude modulation signal, reference 32 designates the first TORP signal, reference 34 designates the second TORP signal, and reference 36 designates the signal corresponding to the coherent combination, here the coherent addition, of the two signals 32 and 34.

In the device 100, each bit of the thermometric code is used, via the control circuit 108, to let through or bar the periodic signal applied at the input of the generator 112 associated with each thermometric bit. Over a period $T_{PRP}$, the value of the amplitude of the output signal outputted by the circuit 118 will correspond to the number of bits of the thermometric code allowing the application of the signal outputted on the line 110 (for example the bits of values '1') on the control inputs of the power supply circuits 116.0-116.M of the generators 112 multiplied by the amplitude of a signal outputted by one of the generators 112.

In device 100, both phase and amplitude modulation techniques can be applied independently to the input signals of a set of generators 112. The phase modulation is applied to the control signals of all generators 112, and the amplitude modulation is applied via the thermometric code which controls the number of TORP signals that are combined together. This technique allows to apply both types of modulation to the final signal at the same time, which results in a generic technique for achieving polar modulation.

Figure 10:
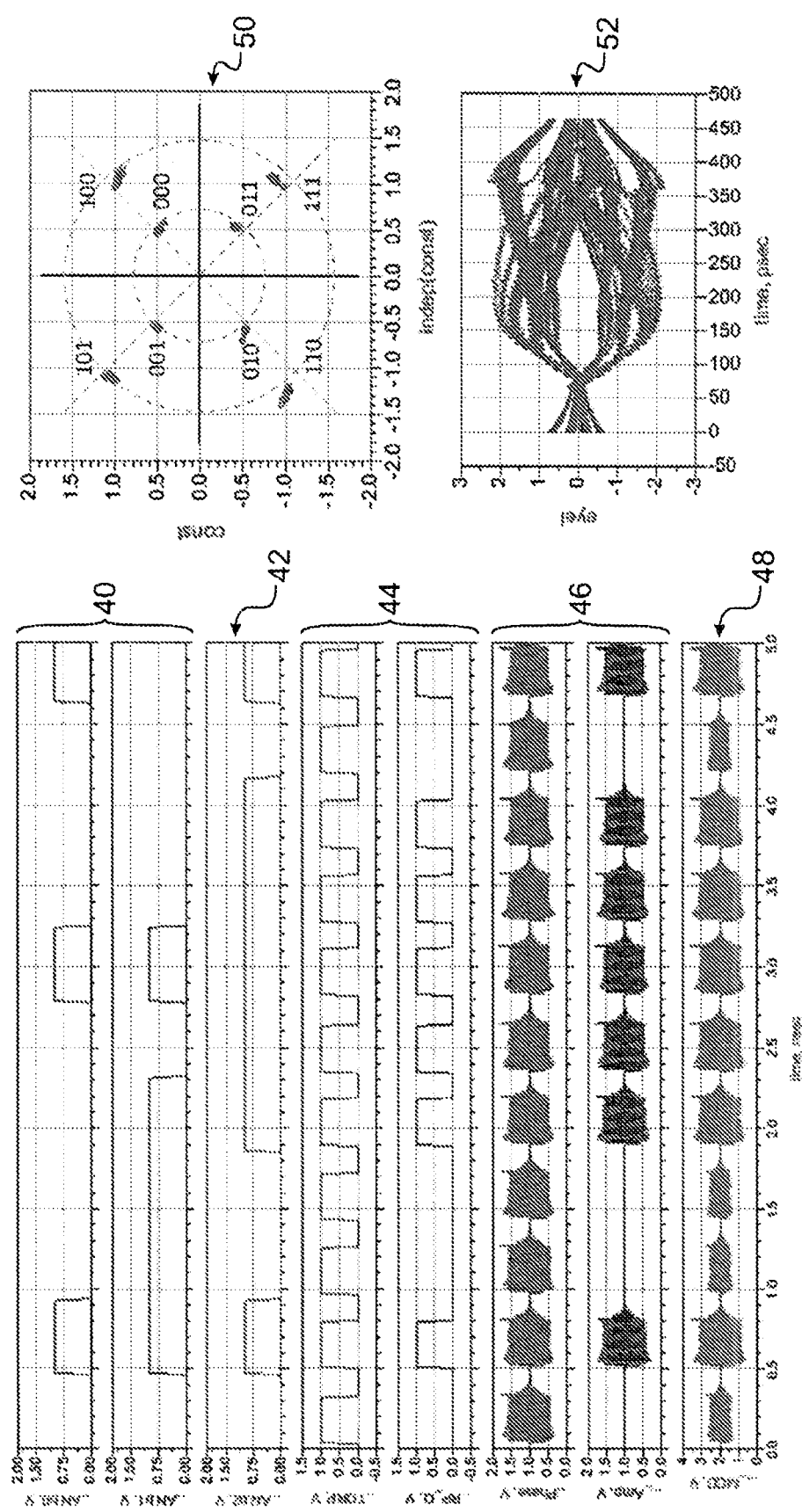
FIGS. 10 and 11 show examples of signals obtained during the implementation of phase and amplitude modulation by a modulation device according to a particular embodiment.

An example of results for a phase and amplitude modulation of three bits, with two bits dedicated to the phase modulation, and the third bit for the amplitude modulation, is illustrated in FIG. 10. Such a modulation is obtained using two TORP signal generators 112. In this FIG. 10, the reference 40 designates the phase modulation signal coded on two bits, the reference 42 designates the amplitude modulation signal coded on 1 bit, the reference 44 designates the control signals of the power supply circuits 116.0 116.M of the generators 112, the reference 46 designates the TORP signals obtained at the output of each of the generators 112, and the reference 48 designates the output signal of the device 100 corresponding to a phase and amplitude-modulated TORP signal. Reference 50 designates the IQ diagram obtained with this modulation. Reference 52 designates the eye diagram obtained with this modulation.

Figure 11:
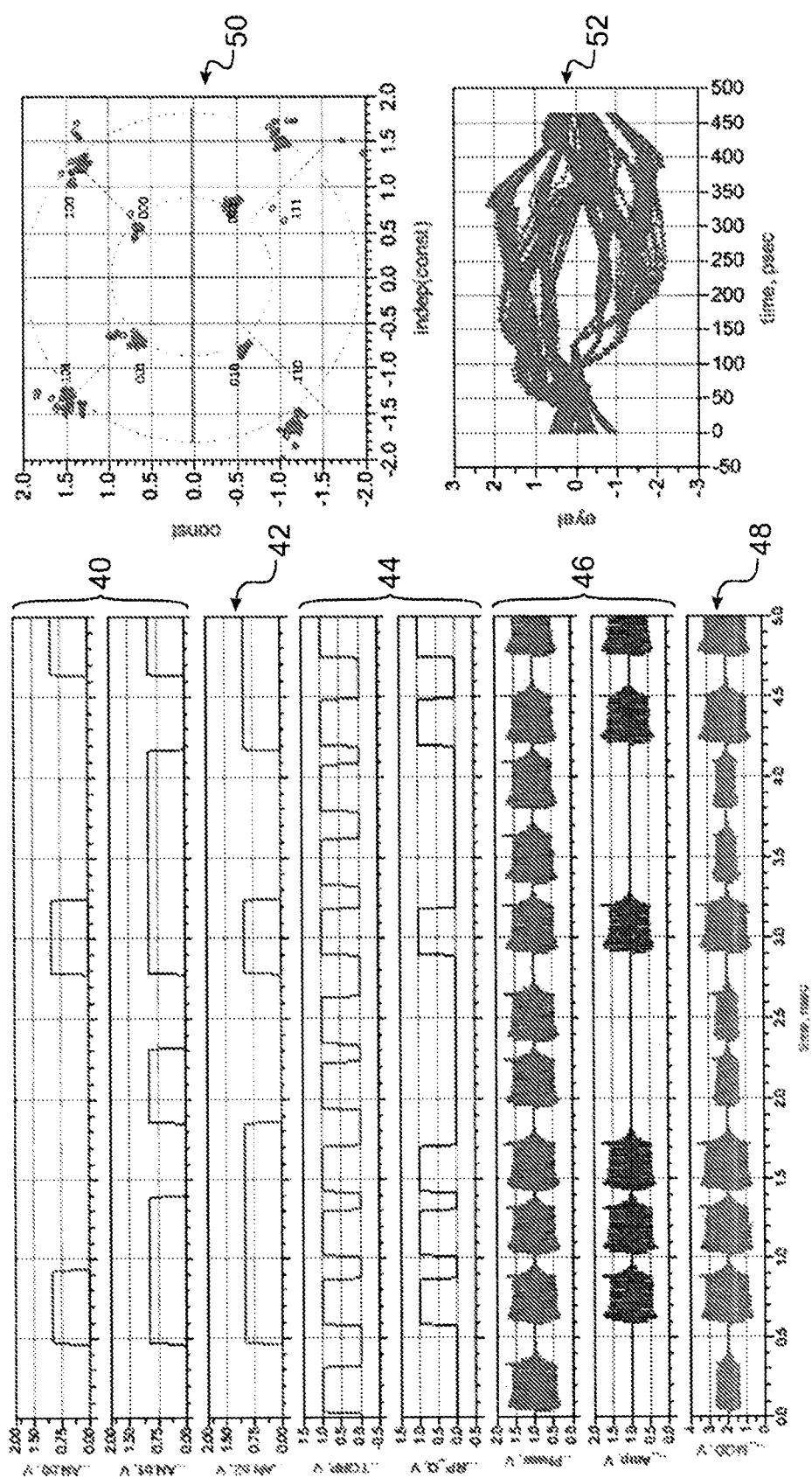

Another example of results for a phase and amplitude modulation of three bits, with two bits dedicated to the phase modulation, and the third bit for the amplitude modulation, is illustrated in FIG. 11. These results are obtained with a device 100 similar to that used to obtain the results of FIG. 10, but wherein the delays of the cells 130 are equal to $\Delta T3$, and not $\Delta T1$ as for the results of FIG. 10.

In the device 100 described above, the modulation performed corresponds to a phase and amplitude modulation.

According to a variant, it is possible that only one amplitude modulation is carried out by the device 100. In this case, the device 100 does not include a generator 122 of the phase-modulated periodic signal of frequency $F_{PRP}$, and the TORP signal generators 112 are then controlled by a control signal of frequency $F_{PRP}$ not including any phase-modulated information.

In the particular embodiment of the device 100 described above, the device 100 includes $2^P$ generators 112. Alternatively, it is possible for the device 100 to include a number of generators 112 greater than $2^P$. In this case, it is possible that only part of the generators 122 are operating simultaneously, the operating generators 112 being able to change periodically.

Alternatively, it is possible for the device 100 to include $2^P-1$ generators 112, with in this case one generator 102 generating a thermometric code signal coded on $2^P-1$ bits. In this configuration, the thermometric code composed of 0 only (for example 0000000 for a binary amplitude modulation signal coded on 3 bits) is considered as corresponding to one of the values of the binary code, and results in a zero amplitude signal on the output of the device 100. Such a thermometric code can also be used in a device 100 including more than $2^P-1$ generators 112.

It is also possible that the device 100 includes only two generators 112. In this case, the device 100 can perform an amplitude modulation with at least 2 different amplitude states: one where only one of the generators 112 emits a TORP signal, and the other where the two generators 112 emit TORP signals.

Furthermore, it is also possible that in the device 100, for a value of the amplitude modulation signal, the thermometric signal is not always identical, with the purpose that it is not always the same generators 112 which emit the highest number of signals. For example, considering the device 100 shown in FIG. 3 wherein the generator 112.0 continuously emits a TORP signal, it is possible that after a certain duration of operation, this continuous sending of a TORP signal is not ensured by the generator 112.0 but by another one of the generators 112.1-112.M. It is possible to ensure a certain rotation of the operation of the generators 112 by shifting the values of the outputs 106 of the generator 102.

Bibliography

[1] A. M. EI-Gabaly and C. E. Saavedra, "A 3-10 GHz 13 pJ/pulse dual BPSK/QPSK pulse modulator based on harmonic injection locking," 2014 *IEEE MTT-S International Microwave Symposium* (*IMS*2014), Tampa, Fla., 2014, pp. 1-4.
[2] S. Y. Lee, H. Ito, N. Ishihara and K. Masu, "A Novel Direct Injection-Locked QPSK Modulator Based on Ring VCO in 180 nm CMOS," in *IEEE Microwave and Wireless Components Letters*, vol. 24, no. 4, pp. 269-271, April 2014.
[3] Y. Lei, X. Xing, H. Feng and Z. Wang, "A 20 Mbps 5.8 mw QPSK transmitter based on injection locking and Class-E PA for wireless biomedical applications," *IEEE 12th International Conference on ASIC* (*ASICON*), Guiyang, 2017, pp. 448-451.
[4] Z. Saheb, E. El-Masry and J. Bousquet, "A 69-Mbps dual tuning 8PSK/QPSK transmitter using injection locking and RF phase modulation," 2017 *IEEE International Symposium on Circuits and Systems* (*ISCAS*), Baltimore, Md., 2017, pp. 1-4.
[5] Z. Ji, S. Zargham and A. Liscidini, "Low-Power QPSK Transmitter Based on an Injection-Locked Power Amplifier," ESSCIRC 2018—IEEE 44th European Solid State Circuits Conference (ESSCIRC), Dresden, 2018, pp. 134-137.
[6] CN 103199796 B.
EP 2 786 492 B1.
EP 2 966 784 B1.

The invention claimed is:
1. An amplitude modulation device with $2^P$ different amplitude states and P integer greater than or equal to 1, comprising at least:
several TORP signal generators, each TORP signal corresponding to oscillation trains periodically repeated at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, each of the TORP signal generators including at least:
an oscillator capable of generating a periodic signal of frequency $F_{OL}$, and
a power supply circuit configured to be controlled by a periodic power supply control signal of frequency $F_{PRP}$ and connected to at least one power supply input of the oscillator as it generates, when the TORP signal generator is intended to generate an oscillation train, a power supply voltage of the oscillator which is non-zero only during part of a period $1/F_{PRP}$,
a generator of a thermometric code signal coded on at least 2P bits and coding an amplitude modulation signal from an information signal comprising data symbols to be coded,
a control circuit for the TORP signal generators, configured to apply or not, to a control input of the power supply circuit of each of the TORP signal generators, a periodic signal of frequency $F_{PRP}$ according to the value of each of the bits of the thermometric code signal, thus coding the data symbols in the power supply control signal, and
a processing circuit comprising inputs coupled to outputs of TORP signal generators, and configured to produce a linear combination of signals applied on its inputs.
2. The device according to claim 1, comprising $2^P$ TORP signal generators, and wherein the thermometric code signal is coded on $2^P$ bits such that, regardless of the value of the information signal, one of the bits of the thermometric code signal has a value different from that of the other bits of the thermometric code signal.
3. The device according to claim 1, wherein the device is configured to perform a phase and amplitude modulation and further includes at least one generator of a phase-modulated periodic signal of frequency $F_{PRP}$, and wherein the control circuit for the TORP signal generators is configured to apply or not, to the control input of the power supply circuit of each of the TORP signal generators, the phase-modulated periodic signal of frequency $F_{PRP}$ depending on the value of each of the bits of the thermometric code signal.
4. The device according to claim 3, wherein the device is configured to perform a phase and amplitude modulation with $2^X$ different phase states, and wherein the generator of the phase-modulated periodic signal of frequency $F_{PRP}$ is configured to apply, to the periodic signal of frequency $F_{PRP}$, and for each symbol to be coded, a delay corresponding to a multiple of $1/(2^X \cdot F_{OL})$, X being an integer greater than or equal to 1.
5. The device according to claim 4, wherein the generator of the phase-modulated periodic signal of frequency $F_{PRP}$ includes at least:
a delay locked loop configured to receive as input the periodic signal of frequency $F_{PRP}$, and
a multiplexer comprising $2^X$ inputs coupled to different delay cells of the delay locked loop and on which $2^X$ periodic signals of frequency $F_{PRP}$ delayed differently from each other are obtained, a control input on which a phase modulation signal determining the phase state to be applied for each symbol is intended to be applied, and an output on which the phase-modulated periodic signal of frequency $F_{PRP}$ is intended to be outputted.
6. The device according to claim 5, wherein:
each delay cell applies a delay $\Delta T_1 = 1/(2^X \cdot N \cdot F_{PRP})$, or
$2^X$ delay cells each apply a delay $\Delta T_1 = 1/(2^X \cdot N \cdot F_{PRP})$, the other delay cells of the delay locked loop apply a delay $\Delta T_2 > \Delta T_1$, or
each delay cell applies a delay $\Delta T_3 = 1/(4 \cdot N \cdot F_{PRP})$.
7. The device according to claim 1, wherein the control circuit for the TORP signal generators includes several AND gates each configured to receive on a first input one of the bits of the thermometric code signal and on a second input the periodic signal of frequency $F_{PRP}$, the outputs of the AND gates on which are outputted the power supply control signals being coupled to the control inputs of the power supply circuits of the TORP signal generators.
8. The device according to claim 1, wherein the generator of the thermometric code signal is configured to receive as input a binary amplitude modulation signal coding on P bits one of $2^P$ different amplitude states, and to convert the binary amplitude modulation signal into a thermometric code signal.

9. The device according to claim 1, wherein the processing circuit corresponds to an adder.

10. The device according to claim 1, wherein the power supply circuit of each of the TORP signal generators includes at least one controlled switch.

11. A phase modulation device, comprising at least one TORP signal generator corresponding to oscillation trains periodically repeated at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, the TORP signal generator including at least:
   an oscillator capable of generating a periodic signal of frequency $F_{OL}$, and
   a power supply circuit configured to be controlled by a periodic power supply control signal of frequency $P_{PRP}$ and connected to at least one power supply input of the oscillator as it generates, when the TORP signal generator is intended to generate an oscillation train, a power supply voltage of the oscillator which is non-zero only during part of a period $1/F_{PRP}$,
   the device further including a generator of a phase-modulated periodic signal of frequency $F_{PRP}$, coding data symbols of an information signal, comprising at least one output on which the phase-modulated periodic signal of frequency $F_{PRP}$ is intended to be outputted and coupled to a control input of the power supply circuit.

12. The device according to claim 11, wherein the device is configured to perform a phase and amplitude modulation, with $2^P$ different amplitude states and P integer greater than or equal to 1, and includes at least:
   $2^P-1$ TORP signal generators,
   a generator of a thermometric code signal coded on at least $2^P-1$ bits and coding an amplitude modulation signal from the information signal,
   a control circuit for the TORP signal generators, configured to apply or not, to a control input of the power supply circuit of each of the TORP signal generators, the phase-modulated periodic signal of frequency $F_{PRP}$ according to the value of each of the bits of the thermometric code signal, and
   a processing circuit comprising at least $2^P-1$ inputs coupled to outputs of TORP signal generators, and configured to produce a linear combination of signals applied on its inputs.

13. The device according to claim 12, comprising $2^P$ TORP signal generators, and wherein the thermometric code signal is coded on $2^P$ bits such that, regardless of the value of the information signal, one of the bits of the thermometric code signal has a value different from that of the other bits of the thermometric code signal.

14. The device according to claim 12, wherein the control circuit for the TORP signal generators includes at least $2^P-1$ AND gates each configured to receive on a first input one of the bits of the thermometric code signal and on a second input the periodic signal of frequency $F_{PRP}$, the outputs of the AND gates on which are outputted the power supply control signals being coupled to the control inputs of the power supply circuits of the TORP signal generators.

15. The device according to claim 12, wherein the generator of the thermometric code signal is configured to receive as input a binary amplitude modulation signal coding on P bits one of $2^P$ different amplitude states, and to convert the binary amplitude modulation signal into a thermometric code signal.

16. The device according to claim 12, wherein the processing circuit corresponds to an adder.

17. The device according to claim 11, wherein the device is configured to perform a phase and amplitude modulation with $2^X$ different phase states, and wherein the generator of the phase-modulated periodic signal of frequency $F_{PRP}$ is configured to apply, to the periodic signal of frequency $F_{PRP}$, and for each symbol to be coded, a delay corresponding to a multiple of $1/(2^X \cdot F_{OL})$, X being an integer greater than or equal to 1.

18. The device according to claim 11, wherein the generator of the phase-modulated periodic signal of frequency $F_{PRP}$ includes at least:
   a delay locked loop configured to receive as input a periodic signal of frequency $F_{PRP}$, and
   a multiplexer comprising $2^X$ inputs coupled to different delay cells of the delay locked loop and on which $2^X$ periodic signals of frequency $F_{PRP}$ delayed differently from each other are obtained, a control input on which a phase modulation signal determining the phase state to be applied for each symbol is intended to be applied, and an output on which the phase-modulated periodic signal of frequency $F_{PRP}$ is intended to be outputted.

19. The device according to claim 18, wherein:
   each delay cell applies a delay $\Delta T_1 = 1/(2^X \cdot N \cdot F_{PRP})$, or
   $2^X$ delay cells each apply a delay $\Delta T_1 = 1/(2^X \cdot N \cdot F_{PRP})$, the other delay cells of the delay locked loop apply a delay $\Delta T_2 > \Delta T_1$, or
   each delay cell applies a delay $\Delta T_3 = 1/(4 \cdot N \cdot F_{PRP})$.

20. A phase and/or amplitude modulation method, comprising at least, when the method performs a phase modulation:
   generation of a phase-modulated periodic signal of frequency $F_{PRP}$; and
   application of the phase-modulated periodic signal of frequency $F_{PRP}$ to a control input of a TORP signal generator corresponding to oscillation trains periodically repeated at a frequency $F_{PRP}$ whose oscillations are of frequency $F_{OL}$ equal to $N \cdot F_{PRP}$, with N integer greater than or equal to 2, and each oscillation train of which has a duration of less than $1/F_{PRP}$, the TORP signal generator including at least:
      an oscillator capable of generating a periodic signal of frequency $F_{OL}$, and
      a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$,
   or including at least, when the TORP signal generator is configured to perform an amplitude modulation with $2^P$ different amplitude states, with P integer greater than or equal to 1:
   generation of a thermometric code signal coded on at least $2^P$ bits and coding an amplitude modulation signal,
   application or not, depending on the value of each of the $2^P$ bits of the thermometric code signal, of the periodic signal of frequency $F_{PRP}$ to each of the control inputs of $2^P$ TORP signal generators, each TORP signal generator including at least:
      an oscillator capable of generating a periodic signal of frequency $F_{OL}$, and a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$, and linear combination of the signals outputted by the $2^P$ TORP signal generators, or including at least, when the TORP signal generator is configured to perform an amplitude and phase modulation with $2^P$ different amplitude states, with P integer greater than or equal to 1:

generation of a phase-modulated periodic signal of frequency $F_{PRP}$;

generation of a thermometric code signal coded on at least $2^P$ bits and coding an amplitude modulation signal, application or not, depending on the value of each of the $2^P$ bits of the thermometric code signal, of the phase-modulated periodic signal of frequency $F_{PRP}$ to each of the control inputs of $2^P$ TORP signal generators, each TORP signal generator including at least:

an oscillator capable of generating a periodic signal of frequency $F_{OL}$, and a power supply circuit configured to be controlled by a periodic signal of frequency $F_{PRP}$ and connected to at least one power supply input of the oscillator such that it generates a power supply voltage of the oscillator which is non-zero only during part of each period $1/F_{PRP}$, and linear combination of the signals outputted by the $2^P$ TORP signal generators.

* * * * *